US009245794B2

(12) United States Patent
Yang et al.

(10) Patent No.: US 9,245,794 B2
(45) Date of Patent: Jan. 26, 2016

(54) FORMATION OF ALLOY LINER BY REACTION OF DIFFUSION BARRIER AND SEED LAYER FOR INTERCONNECT APPLICATION

(75) Inventors: Chih-Chao Yang, Albany, NY (US); Daniel C. Edelstein, Yorktown Heights, NY (US); Takeshi Nogami, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 686 days.

(21) Appl. No.: 13/614,492

(22) Filed: Sep. 13, 2012

(65) Prior Publication Data

US 2013/0000962 A1 Jan. 3, 2013

Related U.S. Application Data

(62) Division of application No. 12/509,885, filed on Jul. 27, 2009, now Pat. No. 8,336,204.

(51) Int. Cl.
*H05K 1/09* (2006.01)
*H01L 21/768* (2006.01)
*H01L 23/532* (2006.01)

(52) U.S. Cl.
CPC .... *H01L 21/76846* (2013.01); *H01L 21/76858* (2013.01); *H01L 21/76867* (2013.01); *H01L 21/76873* (2013.01); *H01L 23/53238* (2013.01); H01L 21/76844 (2013.01); H01L 2924/0002 (2013.01); Y10T 29/49117 (2015.01); Y10T 29/49155 (2015.01); Y10T 29/49165 (2015.01)

(58) Field of Classification Search
CPC .................. H01L 21/76846; H01L 21/76858; H01L 21/76867; H01L 23/53238; H01L 21/76873; H01L 21/76844; Y10T 29/49155; Y10T 29/49117; Y10T 2/49165
USPC .................. 174/255–257, 262; 257/736, 781, 257/E21.174, E21.585
See application file for complete search history.

(56) References Cited

U.S. PATENT DOCUMENTS

| | | |
|---|---|---|
| 5,221,449 A | 6/1993 | Colgan et al. |
| 5,281,485 A | 1/1994 | Colgan et al. |
| 5,930,669 A | 7/1999 | Uzoh |
| 6,037,256 A | 3/2000 | Weinrich et al. |
| 6,181,012 B1 | 1/2001 | Edelstein et al. |
| 6,291,885 B1 | 9/2001 | Cabral, Jr. et al. |
| 6,337,151 B1 | 1/2002 | Uzoh et al. |
| 6,399,496 B1 * | 6/2002 | Edelstein et al. ............. 438/687 |
| 6,429,519 B1 | 8/2002 | Uzoh |
| 6,437,440 B1 | 8/2002 | Cabral, Jr. et al. |
| 6,457,234 B1 | 10/2002 | Edelstein et al. |
| 6,569,783 B2 | 5/2003 | Uzoh et al. |
| 6,779,711 B2 | 8/2004 | Edelstein et al. |
| 6,787,912 B2 | 9/2004 | Lane et al. |

(Continued)

*Primary Examiner* — Hoa C Nguyen
(74) *Attorney, Agent, or Firm* — Scully, Scott, Murphy & Presser, P.C.

(57) ABSTRACT

An interconnect structure including an alloy liner positioned directly between a diffusion barrier and a Cu alloy seed layer as well as methods for forming such an interconnect structure are provided. The alloy liner of the present invention is formed by thermally reacting a previously deposited diffusion barrier metal alloy layer with an overlying Cu alloy seed layer. During the thermal reaction, the metal alloys from the both the diffusion barrier and the Cu alloys seed layer react forming a metal alloy reaction product between the diffusion barrier and the Cu seed layer.

17 Claims, 3 Drawing Sheets

(56) References Cited

U.S. PATENT DOCUMENTS

| | | |
|---|---|---|
| 6,812,143 B2 | 11/2004 | Lane et al. |
| 6,844,261 B2 | 1/2005 | Marsh et al. |
| 6,861,355 B2 | 3/2005 | Marsh |
| 6,992,390 B2 | 1/2006 | Edelstein et al. |
| 7,081,680 B2 | 7/2006 | Edelstein et al. |
| 7,119,018 B2 | 10/2006 | Lane et al. |
| 7,327,033 B2 | 2/2008 | Edelstein et al. |
| 7,732,331 B2 * | 6/2010 | Kim et al. ............ 438/687 |
| 7,880,303 B2 * | 2/2011 | Yu et al. ............... 257/751 |
| 2006/0252250 A1 * | 11/2006 | Teng et al. ............ 438/618 |
| 2007/0148944 A1 * | 6/2007 | Lee ........................ 438/597 |
| 2011/0084393 A1 * | 4/2011 | Cabral et al. .......... 257/751 |

* cited by examiner

FORMATION OF ALLOY LINER BY REACTION OF DIFFUSION BARRIER AND SEED LAYER FOR INTERCONNECT APPLICATION

CROSS REFERENCE TO RELATED APPLICATION

This application is a divisional of U.S. patent application Ser. No. 12/509,885, filed Jul. 27, 2009 the entire content and disclosure of which is incorporated herein by reference.

BACKGROUND

The present invention relates to a semiconductor structure and a method of fabricating the same. More particularly, the present invention relates to an interconnect structure in which an alloy liner is positioned between an underlying diffusion barrier and a seed layer. The alloy liner of the present invention is comprised of a reaction product between the underlying diffusion barrier and the seed layer. The invention also provides methods of forming such an interconnect structure.

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, -based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than silicon dioxide.

In current technologies, a material stack including, from bottom to top, a TaN diffusion barrier, a Ta layer for adhesion and electromigration redundancy/enhancement, and a Cu alloy plating seed layer is used for advanced interconnect applications. Although Cu alloy plating seed layers such as, for example, CuIr, CuAl and CuRu, are known to improve seed layer coverage, e.g., provide conformality enhancement, the use of Cu alloy plating seed layers increases the resistance of the final interconnect structure. Also, higher resistivity of Cu alloy seed layer could result in more challenges, e.g., uniformity control during a later Cu plating process.

In view of the above, there is a need for providing an interconnect structure in which a Cu alloy plating seed layer can be employed without increasing the resistance within the final interconnect structure and no drawbacks for subsequent Cu plating.

BRIEF SUMMARY

The present invention provides an interconnect structure including a metal alloy liner positioned directly between an underlying diffusion barrier and an overlying Cu alloy seed layer and methods for forming such an interconnect structure. The metal alloy liner of the present invention is formed by thermally reacting a previously deposited diffusion barrier metal alloy layer with an overlying Cu alloy seed layer. During the thermal reaction, the metal alloys from the both the diffusion barrier and the Cu alloy seed layer react forming a metal alloy reaction product between the diffusion barrier and the Cu seed layer. The interconnect structure of the present invention includes the advantages of both the diffusion barrier and the Cu seed layer without impacting the wiring resistance (e.g., increases the wiring resistance) of the structure. Formation of the metal alloy liner also decreases the resistivity of the Cu alloy seed, which is beneficial for later Cu plating process control. This is unlike prior art interconnect structure in which wiring resistance is negatively impacted when conventional diffusion barrier/Cu seed layer technology is employed.

In general terms, the inventive interconnect structure includes a dielectric material including at least one opening therein; an alloy metal A deficient diffusion barrier located within the at least one opening; an alloy liner located on the alloy metal A deficient diffusion barrier; an alloy metal B deficient Cu alloy seed layer located on the alloy liner; and an interconnect conductive material located within the at least one opening atop said alloy metal B deficient Cu alloy seed layer. In accordance with the present invention, alloy liner is a thermal reaction product of alloy metal A and alloy metal B, wherein alloy metal A is a transition metal selected from Group IVB, VB, VIB, VIIB or VIII of the Periodic Table of Elements, and alloy metal B is a transition metal from Group IVB, VB, VIB, VIIB or VIII of the Periodic Table of Elements or a metal from Group IIIA of the Periodic Table of Elements, with the proviso that alloy metal B is different from alloy metal A. All references to the Periodic Table of Elements use CAS nomenclature.

In addition to providing the above mentioned interconnect structure, the present invention also includes a method of forming the same. In particular, the present invention provides a method of forming an interconnect structure that includes forming at least one opening in a dielectric material. A diffusion barrier is then formed on at least exposed wall portions of the dielectric material within the at least one opening. The diffusion barrier employed in the instant invention includes at least an alloy metal A. Next, a Cu alloy seed layer including an alloy metal B is formed on the diffusion barrier. An alloy liner comprised of a thermal reaction product of alloy metal A and alloy metal B is then formed by annealing. The annealing step employed in the present invention causes diffusion of alloy metal A from the diffusion barrier and diffusion of alloy metal B from the Cu alloy seed layer and formation of the alloy liner directly between an underlying alloy metal A deficient diffusion barrier and an overlying alloy metal B deficient Cu alloy seed layer.

In some embodiments of the invention, an interconnect conductive material is formed within the at least one opening after forming the alloy liner. In other embodiments of the invention, an interconnect conductive material is formed within the at least one opening between the step of forming of the Cu alloy seed layer and the step of forming of the alloy liner.

Figure 2:
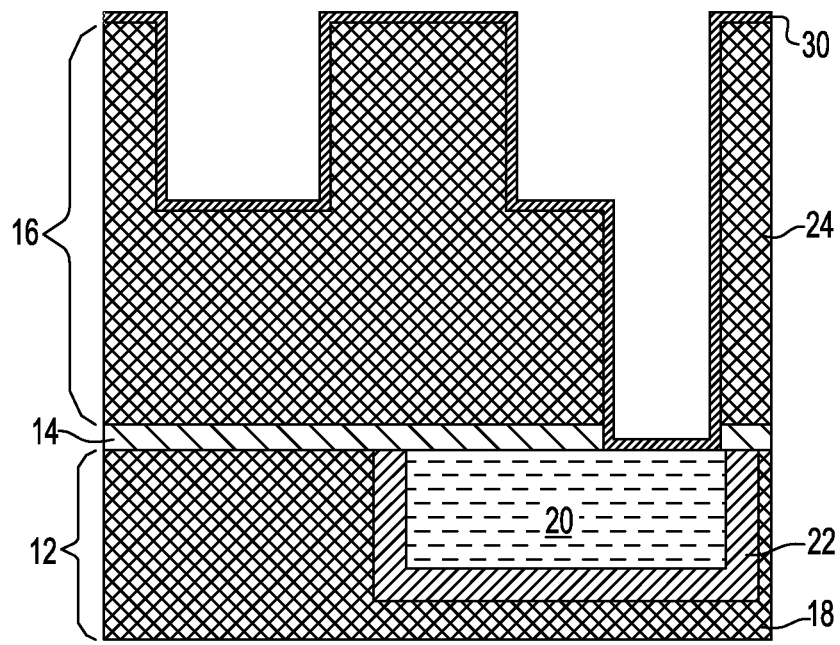
FIG. 2 is a pictorial representation (through a cross sectional view) illustrating the interconnect structure of FIG. 1 after providing a diffusion barrier comprising a metal alloy lining at least the exposed surfaces within the at least one opening.
Figure 3:
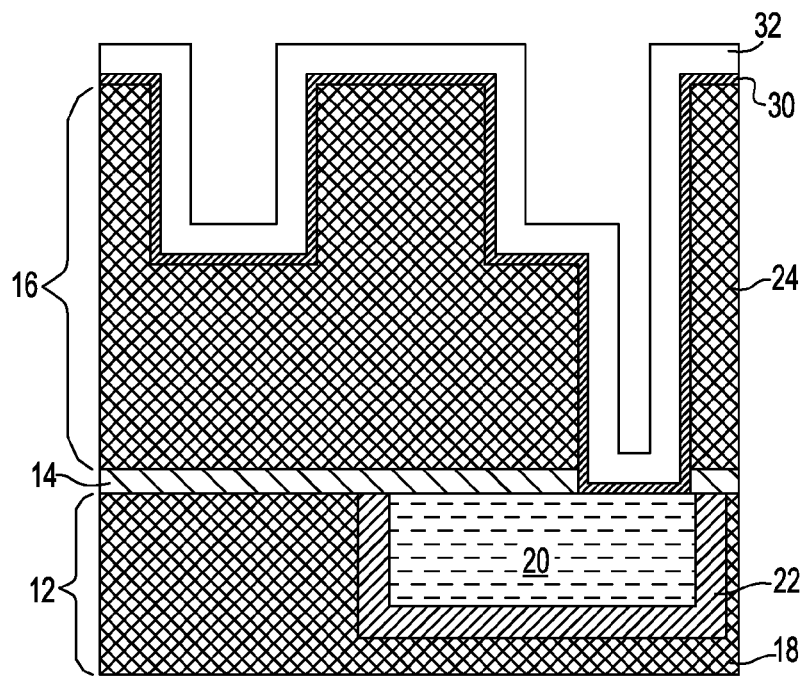

FIG. 3 is a pictorial representation (through a cross sectional view) illustrating the interconnect structure of FIG. 2 after forming a Cu alloy seed layer on the upper exposed surface of the diffusion barrier.

Figure 4:
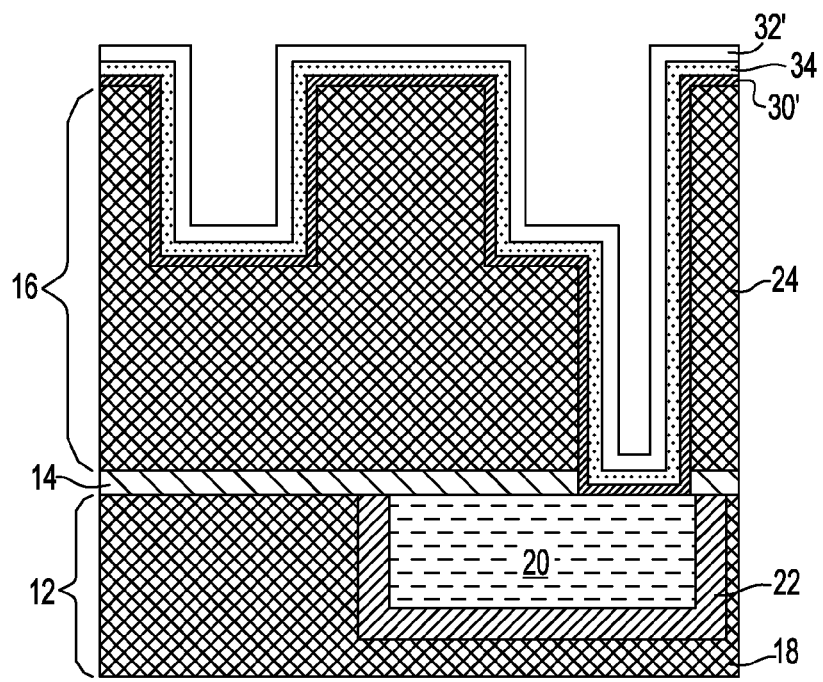

FIG. 4 is a pictorial representation (though a cross sectional view) illustrating the interconnect structure of FIG. 3 after annealing and formation of an alloy liner between the diffusion barrier and the Cu alloy seed layer.

Figure 5:
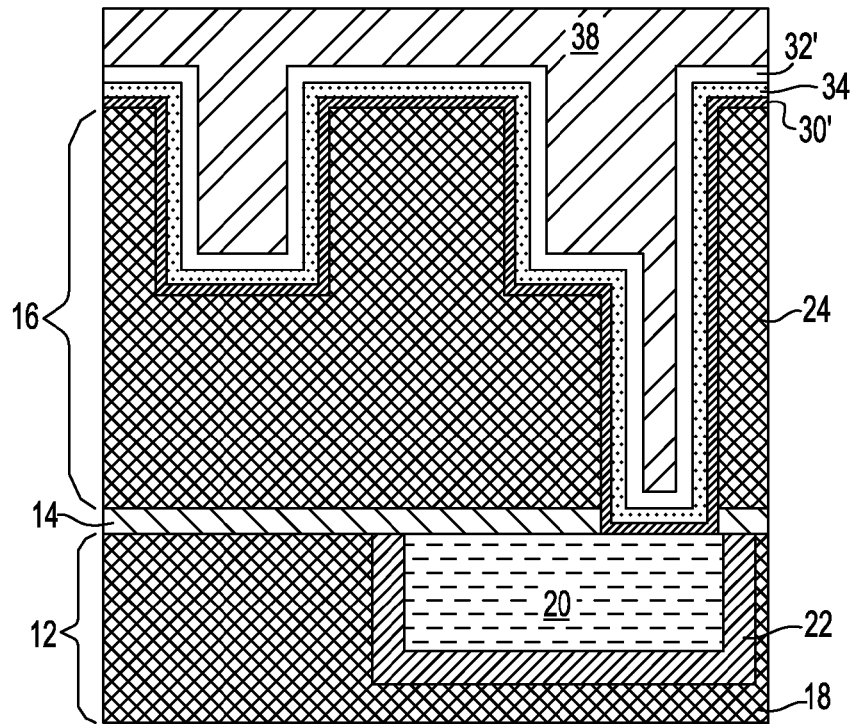

FIG. 5 is pictorial representation (through a cross sectional view) illustrating the structure of FIG. 4 after forming a conductive material on the exposed surface of the Cu alloy seed layer.

Figure 6:
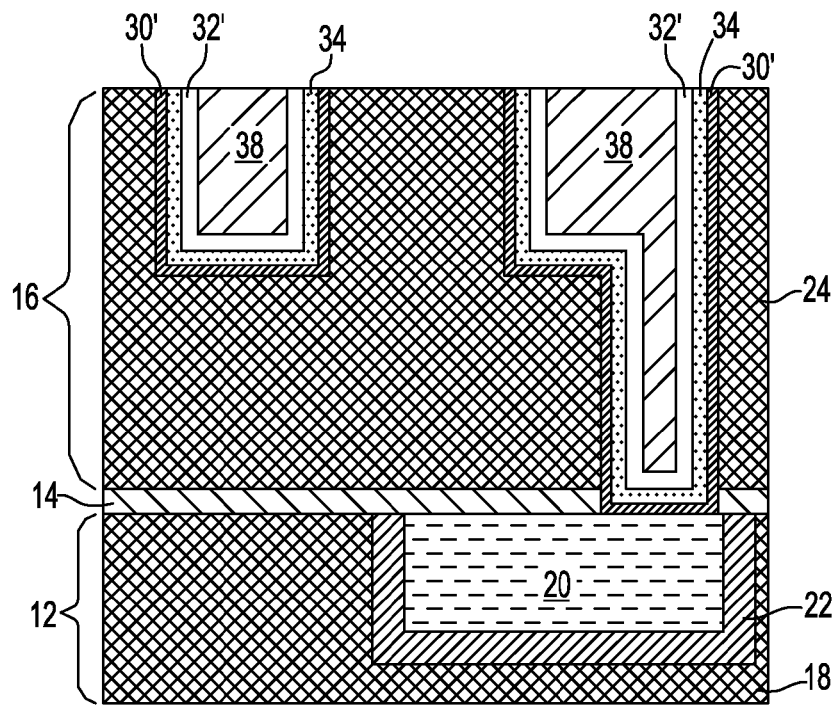

FIG. 6 is a pictorial representation (through a cross sectional view) illustrating the structure of FIG. 5 after planarization.

DETAILED DESCRIPTION

The present invention, which provides an interconnect structure including a metal alloy liner positioned directly between a diffusion barrier and a Cu alloy seed layer and methods for forming such an interconnect structure, will now be described in greater detail by referring to the following discussion and drawings that accompany the present application. The drawings of the present application, which are referred to herein below in greater detail, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides an interconnect structure including a metal alloy liner positioned directly between an underlying diffusion barrier and an overlying Cu alloy seed layer and methods for forming such an interconnect structure. The metal alloy liner of the present invention is formed by thermally reacting a previously deposited diffusion barrier metal alloy layer with an overlying Cu alloy seed layer. During the thermal reaction, the metal alloys from the both the diffusion barrier and the Cu alloys seed layer react forming a metal alloy reaction product between the diffusion barrier and the Cu seed layer.

Figure 1:
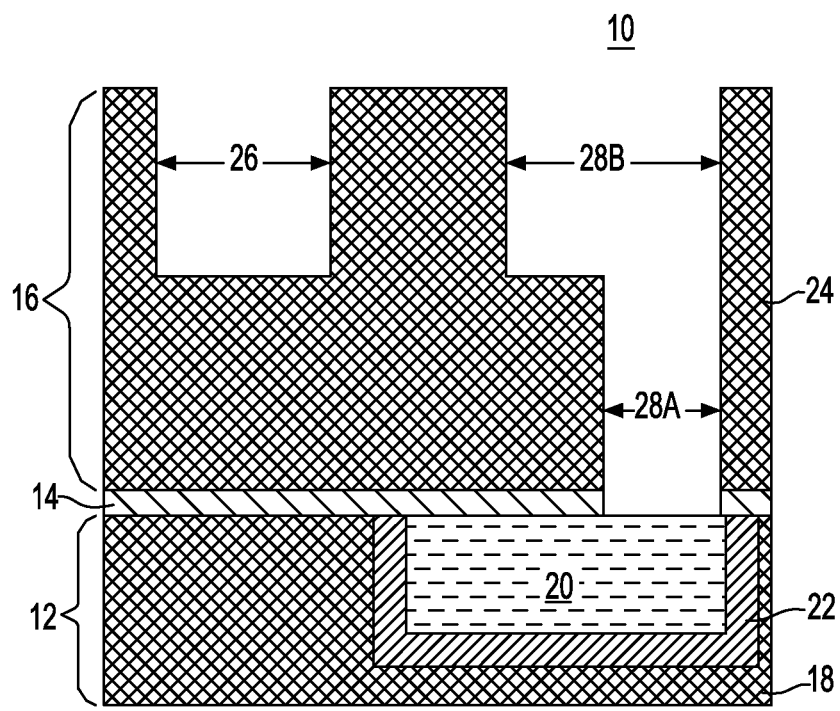
FIG. 1 is a pictorial representation (through a cross sectional view) illustrating an initial interconnect structure through initial stages of the inventive method wherein at least one opening is provided into an upper dielectric material.

In one embodiment of the present invention, the inventive process flow begins with providing the initial interconnect structure 10 shown in FIG. 1. Specifically, the initial interconnect structure 10 shown in FIG. 1 comprises a multilevel interconnect including a lower interconnect level 12 and an upper interconnect level 16 that are separated in part by a dielectric capping layer 14. The lower interconnect level 12 comprises a first dielectric material 18 having at least one conductive feature (i.e., conductive region) 20 that is separated from the first dielectric material 18 by a barrier layer 22. The upper interconnect level 16 comprises a second dielectric material 24 that has at least one opening located therein. In FIG. 1, two openings are shown; reference number 26 denotes a line opening for a single damascene structure, and reference numeral 28A and 28B denote a via opening and a line opening, respectively for a dual damascene structure. Although FIG. 1 illustrates a separate line opening and an opening for a via and a line, the present invention also contemplates cases in which only the line opening is present or cases in which the opening for the combined via and line is present.

The initial interconnect structure 10 shown in FIG. 1 is made utilizing standard interconnect processing which is well known in the art. For example, the initial interconnect structure 10 can be formed by first applying the first dielectric material 18 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 18 of the lower interconnect level 12 may comprise any interlevel or intralevel dielectric including inorganic dielectrics or organic dielectrics. The first dielectric material 18 may be porous or non-porous. Some examples of suitable dielectrics that can be used as the first dielectric material 18 include, but are not limited to $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 18 typically has a dielectric constant that is about 4.0 or less, with a dielectric constant of about 2.8 or less being even more typical. It is noted that all dielectric constants reported herein are measured relative to a vacuum. These dielectrics generally have a lower parasitic crosstalk as compared with dielectric materials that have a higher dielectric constant than 4.0. The thickness of the first dielectric material 18 may vary depending upon the dielectric material used as well as the exact number of dielectrics within the lower interconnect level 12. Typically, and for normal interconnect structures, the first dielectric material 18 has a thickness from 200 nm to 450 nm.

The lower interconnect level 12 also has at least one conductive feature 20 that is embedded in (i.e., located within) the first dielectric material 18. The least one conductive feature 20 comprises a conductive region that is separated from the first dielectric material 18 by a barrier layer 22. The at least one conductive feature 20 is formed by lithography (i.e., applying a photoresist to the surface of the first dielectric material 18, exposing the photoresist to a desired pattern of radiation, and developing the exposed resist utilizing a conventional resist developer), etching (dry etching or wet etching) at least one opening in the first dielectric material 18 and filling the etched region with the barrier layer 22 and then with a conductive material forming the conductive region. The barrier layer 22, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the barrier layer 22 may vary depending on the exact means of the deposition process as well as the material employed. Typically, the barrier layer 22 has a thickness from 4 nm to 40 nm, with a thickness from 7 nm to 20 nm being more typical.

Following the barrier layer 22 formation, the remaining region of the at least one opening within the first dielectric material 18 is filled with a conductive material forming the at least one conductive feature 20. The conductive material used in forming the at least one conductive feature 20 includes, for example, polySi, a conductive metal, an alloy comprising at least one conductive metal, a conductive metal silicide or combinations thereof. Preferably, the conductive material that is used in forming the at least one conductive feature 20 is a conductive metal such as Cu, W or Al, with Cu or a Cu alloy (such as AlCu) being highly preferred in the present invention. The conductive material is filled into the remaining opening in the first dielectric material 18 utilizing a conventional deposition process including, but not limited to CVD, PECVD, sputtering, chemical solution deposition or plating. After deposition, a conventional planarization process such as, for example, chemical mechanical polishing (CMP) can be used to provide a structure in which the barrier layer 22 and the conductive feature 20 each have an upper surface that is substantially coplanar with the upper surface of the first dielectric material 18.

After forming the at least one conductive feature 20, the dielectric capping layer 14 is formed on the surface of the lower interconnect level 12 utilizing a conventional deposition process such as, for example, CVD, PECVD, chemical solution deposition, or evaporation. The dielectric capping layer 14 comprises any suitable dielectric capping material such as, for example, SiC, $Si_4NH_3$, $SiO_2$, a carbon doped oxide, a nitrogen and hydrogen doped silicon carbide SiC(N, H) or multilayers thereof. The thickness of the dielectric capping layer 14 may vary depending on the technique used to form the same as well as the material make-up of the layer. Typically, the dielectric capping layer 14 has a thickness from 15 nm to 55 nm, with a thickness from 25 nm to 45 nm being more typical.

Next, the upper interconnect level 16 is formed by applying the second dielectric material 24 to the upper exposed surface of the dielectric capping layer 14. The second dielectric material 24 may comprise the same or different, preferably the same, dielectric material as that of the first dielectric material 18 of the lower interconnect level 12. The processing techniques and thickness ranges for the first dielectric material 18 are also applicable here for the second dielectric material 24. Next, at least one opening is formed into the second dielectric material 24 utilizing lithography, as described above, and etching. The etching may comprise a dry etching process, a wet chemical etching process or a combination thereof. The term "dry etching" is used herein to denote an etching technique such as reactive-ion etching, ion beam etching, plasma etching or laser ablation. In FIG. 1, two openings are shown; reference number 26 denotes a line opening for a single damascene structure, and reference numeral 28A and 28B denote a via opening and a line opening, respectively for a dual damascene structure. It is again emphasized that the present invention contemplates structures including only opening 26 or openings 28A and 28B.

In the instances when a via opening 28A and a line opening 28B are formed, the etching step also removes a portion of the dielectric capping layer 14 that is located atop the conductive feature 20 in order to make electrical contact between interconnect level 12 and level 16. It is noted that when via opening 28A and line opening 28B are formed any conventional dual damascene process can be used to form the same.

Next, a diffusion barrier 30 having Cu diffusion barrier properties is formed on exposed surfaces (including wall surfaces within the opening) on the second dielectric material 24. The resultant structure is shown, for example, in FIG. 2.

The diffusion barrier 30 employed in the present invention comprises a compound including at least an alloy metal A and, optionally, a diffusion barrier metal $M^1$ and/or nitrogen. In a preferred embodiment of the invention, the diffusion barrier includes both $M^1$ and nitrogen, and thus a diffusion barrier alloy comprised of $M^1A(N)$ is employed. The diffusion barrier metal $M^1$ of diffusion barrier 30 may comprise Ta, Ti, Ru, W, Co, W, Ir, Rh, Pt or any other metal that can serve as a barrier to prevent a conductive material from diffusing there through. In one preferred embodiment of the invention, $M^1$ is Ta. The alloy metal A of diffusion barrier 30 includes a transition metal from Group IVB, VB, VIB, VIIB or VIII of the Periodic Table of Elements that is the same or different from $M^1$. Thus, in some embodiments alloy metal A is the same as $M^1$, while in other embodiments alloy metal A is different from $M^1$. Preferably, alloy metal A is different from $M^1$ and is one of Ru, Ir, Co or Pt. In a highly preferred embodiment of the invention, the diffusion barrier 30 is a $M^1A(N)$ compound of TaRuN, TaIrN, TaCoN, TaPtN or such compounds without nitrogen.

The diffusion barrier 30 is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. The thickness of the diffusion barrier 30 may vary depending on the number of material layers within the barrier, the technique used in forming the same as well as the material of the diffusion barrier itself. Typically, the diffusion barrier 30 has a thickness from 4 nm to 40 nm, with a thickness from 7 nm to 20 nm being even more typical.

FIG. 3 shows the structure of FIG. 2 after formation of a Cu alloy seed layer 32 atop the diffusion barrier 30. The Cu alloy seed layer 32 of the present invention is comprised of Cu and an alloy metal B. Alloy metal B includes a transition metal from Group IVB, VB, VIB, VIIB or VIII of the Periodic Table of Elements or a metal from Group IIIA of the Periodic Table of Elements, with the proviso that alloy metal B is different from alloy metal A. In embodiments in which diffusion barrier 30 includes alloy metal A and $M^1$, alloy metal B is different from either $M^1$ and alloy metal A. Examples of preferred metals for alloy metal B include Al, Ir, Pt, Co, Ru, Rh and Mn. In some embodiments, it is preferred to use one of Al, Ir, Pt or Mn as alloy metal B.

The Cu alloy seed layer 32 is formed by a conventional deposition process including, for example, chemical vapor deposition (CVD), plasma enhanced chemical vapor deposition (PECVD), atomic layer deposition (ALD), plating, sputtering and physical vapor deposition (PVD). The thickness of the Cu alloy seed layer 32 may vary depending on number of factors including, for example, the compositional material of the Cu alloy seed layer 32 and the technique that was used in forming the same. Typically, the Cu alloy seed layer 32 has a thickness from 0.5 nm to 10 nm, with a thickness of less than 6 nm being even more typical.

FIG. 4 shows the structure after annealing and formation of an alloy liner 34 directly between the diffusion barrier 30 and the Cu alloy seed layer 32. The alloy liner 34 is an in-situ formed reaction product that includes a combination of alloy metal A from diffusion barrier 30 and alloy metal B from Cu alloy seed layer 32. The alloy liner 34 is a result of diffusion of alloy metals A and B from layers 30 and 32, respectively, and thermal mixing of the alloy metals A and B. The annealing process may partially or completely remove, via diffusion, alloy metal A from the diffusion barrier 30, while simultaneously completely or partially removing alloy metal B, via diffusion, from the Cu alloy seed layer 32. Notwithstanding the amount of alloy metal A and alloy metal B removal from the diffusion barrier 30 and the Cu alloy seed layer 32, the diffusion barrier 30' after annealing has a lower content of alloy metal A as compared to the diffusion barrier 30 prior to annealing. Likewise, the Cu alloy seed layer 32' after annealing has a lower content of alloy metal B as compared to the Cu alloy seed layer 32 prior to annealing. Also, the annealed Cu alloy seed layer 32' has a lower resistivity than the original Cu alloy seed layer 32 because of a lower content of alloy metal B. The annealed and thus alloy metal A deficient barrier layer is labeled as element 30' in FIG. 4, while the annealed and thus alloy metal B deficient Cu seed layer is labeled as element 32' in FIG. 4.

The annealing which forms alloy liner 34 is typically performed at a temperature that is from 100° C. to 500° C., with an annealing temperature from 150° C. to 300° C. being even more typical. The annealing step of the present invention is performed in an inert ambient including He, Ar, Ne, Xe, Kr and mixtures thereof. Nitrogen can also be used as an inert ambient alone or in admixture with one of the inert ambients previously mentioned.

The thickness of the alloy liner 34 varies depending on the conditions of the anneal. Typically, and by way of an example, alloy liner 34 has a thickness from 0.5 nm to 50 nm, with a thickness from 1 nm to 20 nm being more typical.

FIG. 5 shows the structure after forming an interconnect conductive material 38 within the at least one opening. The structure shown in FIG. 5 represents one possible embodiment of the present invention in which a closed-via bottom structure is shown. In some embodiments (not shown), the interconnect conductive material 38 is formed within an open-via bottom structure. The open-via structure is formed by removing layers 30', 34 and 32' from the bottom of via 28A utilizing ion bombardment or another like directional etching process prior to deposition of the other elements.

The interconnect conductive material 38 may comprise the same or different, preferably the same, conductive material as that of the conductive feature 20. Preferably, Cu, Al, W or alloys thereof are used, with Cu or AlCu being most preferred.

The conductive material 38 is formed utilizing the same deposition processing as described above in forming the at least one conductive feature 20.

Following deposition of the conductive material 38, the structure shown in FIG. 5 is subjected to planarization providing the structure shown in FIG. 6. The planarization process removes the diffusion barrier 30', the alloy liner 34, the Cu alloy seed layer 32' and conductive material 38 that is present above the upper horizontal surface of the upper interconnect level 16.

Planarization may include chemical mechanical polishing (CMP), grinding or a combination thereof. After planarization, diffusion barrier 30', alloy liner 34 and Cu alloy seed layer 32' each is essentially U-shaped, confined to the at least one opening in second dielectric material 24, and has an upper surface that is co-planar with an upper surface of the second dielectric material 24. See the structure shown in FIG. 6.

It is noted that the above description provides one method of fabricating the structure shown in FIG. 6. In addition to the method described above, the present invention also works by forming the alloy liner 34 between the steps of forming the interconnect conductive material 38 and planarization. When this embodiment is performed, the structure shown in FIG. 3 is first formed, then the interconnect conductive material 38 is formed and thereafter annealing is performed which causes the reactive formation between the diffusion barrier 30 and Cu alloy seed layer 32 forming the alloy liner 32 between alloy A deficient diffusion barrier 30' and alloy B deficient Cu alloy seed layer 32'.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
    a dielectric material including at least one opening therein;
    an alloy metal A deficient diffusion barrier located within said at least one opening;
    an alloy liner located directly on said alloy metal A deficient diffusion barrier, said alloy liner consists of a thermal reaction product of alloy metal A and alloy metal B;
    an alloy metal B deficient Cu alloy seed layer located directly on said alloy liner; and
    an interconnect conductive material located within the at least one opening atop said alloy metal B deficient Cu alloy seed layer, wherein alloy metal A is a transition metal selected from Group IVB, VB, VIB, VIIB or VIII of the Periodic Table of Elements, and alloy metal B is a transition metal from Group IVB, VB, VIB, VIIB or VIII of the Periodic Table of Elements or a metal from Group IIIA of the Periodic Table of Elements, with the proviso that alloy metal B is different from alloy metal A.

2. The interconnect structure of claim 1 wherein said dielectric material is one of $SiO_2$, a silsesquioxane, a C doped oxide that includes atoms of Si, C, O and H, or a thermosetting polyarylene ether.

3. The interconnect structure of claim 1 wherein said at least one opening is a line opening, a combined line opening and via opening, or combinations thereof.

4. The interconnect structure of claim 1 wherein said alloy metal A deficient diffusion barrier further includes $M^1$ wherein $M^1$ is one of Ta, Ti, Ru, W, Co, W, Ir, Rh or Pt and $M^1$ is different from alloy metal A.

5. The interconnect structure of claim 4 wherein said alloy metal A deficient diffusion barrier further includes nitrogen.

6. The interconnect structure of claim 1 wherein said alloy metal A deficient diffusion barrier further includes nitrogen.

7. The interconnect structure of claim 1 wherein said alloy metal A is one of Ru, Ir , Co or Pt, and alloy metal B is one of Al, Ir, Pt or Mn.

8. The interconnect structure of claim 1 wherein said alloy metal A deficient diffusion barrier is completely devoid of alloy metal A and said alloy B deficient Cu alloy seed layer is completely devoid of alloy metal B.

9. The interconnect structure of claim 1 wherein said interconnect conductive material is one of a conductive metal, an alloy comprising at least one conductive metal, or a conductive metal silicide.

10. The interconnect structure of claim 9 wherein said interconnect conductive material is a conductive metal selected from the group consisting of Cu, Al, W and AlCu.

11. The interconnect structure of claim 1 wherein said alloy metal A deficient diffusion barrier, said alloy liner and said an alloy metal B deficient Cu alloy seed layer are each continuously present within said at least one opening.

12. The interconnect structure of claim 1 wherein said alloy metal A deficient diffusion barrier, said alloy liner and said an alloy metal B deficient Cu alloy seed layer are absent from a bottom portion of said at least one opening.

13. The interconnect structure of claim 1 wherein said alloy metal A deficient diffusion barrier, said alloy liner and said an alloy metal B deficient Cu alloy seed layer each have an uppermost surface that is coplanar with an uppermost surface of the dielectric material and said interconnect conductive material.

14. The interconnect structure of claim 1 further comprising another dielectric material including another interconnect conductive material located beneath said dielectric material.

15. The interconnect structure of claim 14 wherein a portion of said alloy metal A deficient diffusion barrier within a bottom portion of said at least one opening is in direct contact with a portion of said another interconnect conductive material.

16. The interconnect structure of claim 14 further comprising dielectric capping layer positioned between said dielectric material and said another dielectric material, wherein said dielectric capping layer includes a second opening located therein that exposes an uppermost surface of a portion of said another interconnect conductive material.

17. The interconnect structure of claim 16 wherein a portion of said alloy metal A deficient diffusion barrier contacts a sidewall of said dielectric capping layer.

* * * * *